United States Patent [19]
Schneider, III

[11] Patent Number: 5,278,511
[45] Date of Patent: Jan. 11, 1994

[54] COMPACT LAMP AND CIRCUIT TESTER FOR VEHICLES, PARTICULARLY AUTOMOBILES

[76] Inventor: Henry J. Schneider, III, 905 Powers Rd., Woodstock, Ill. 60098

[21] Appl. No.: 894,283

[22] Filed: Jun. 4, 1992

[51] Int. Cl.[5] ............... G01R 31/00; G01R 31/02; G01R 19/14
[52] U.S. Cl. .................................. 324/503; 324/414; 324/133
[58] Field of Search ............... 324/414, 133, 503, 504, 324/555, 556, 500, 537

[56] References Cited
U.S. PATENT DOCUMENTS 4,547,722  10/1985  Sarlo ................................. 324/504

*Primary Examiner*—Walter E. Snow
*Attorney, Agent, or Firm*—Allen D. Gutchess, Jr.

[57] ABSTRACT

A tester for testing sealed lamps and lamp circuits of vehicles includes an elongate housing. The housing has pointed projections extending from one end wall to be received in a base of a lamp and has blunt projections with recesses in the other end wall to receive the prongs of a plug or pigtail which is normally inserted into the base of a lamp. Each of the ends of a bottom wall of the housing have two ports through which light sources, preferably LEDs, are visible and light when the lamp or circuit is functional. A battery is also carried in the housing for the lamp circuit. In a preferred form, the end walls are slidably held by the housing so as to be removable for replacement purposes and to facilitate manufacture.

17 Claims, 1 Drawing Sheet

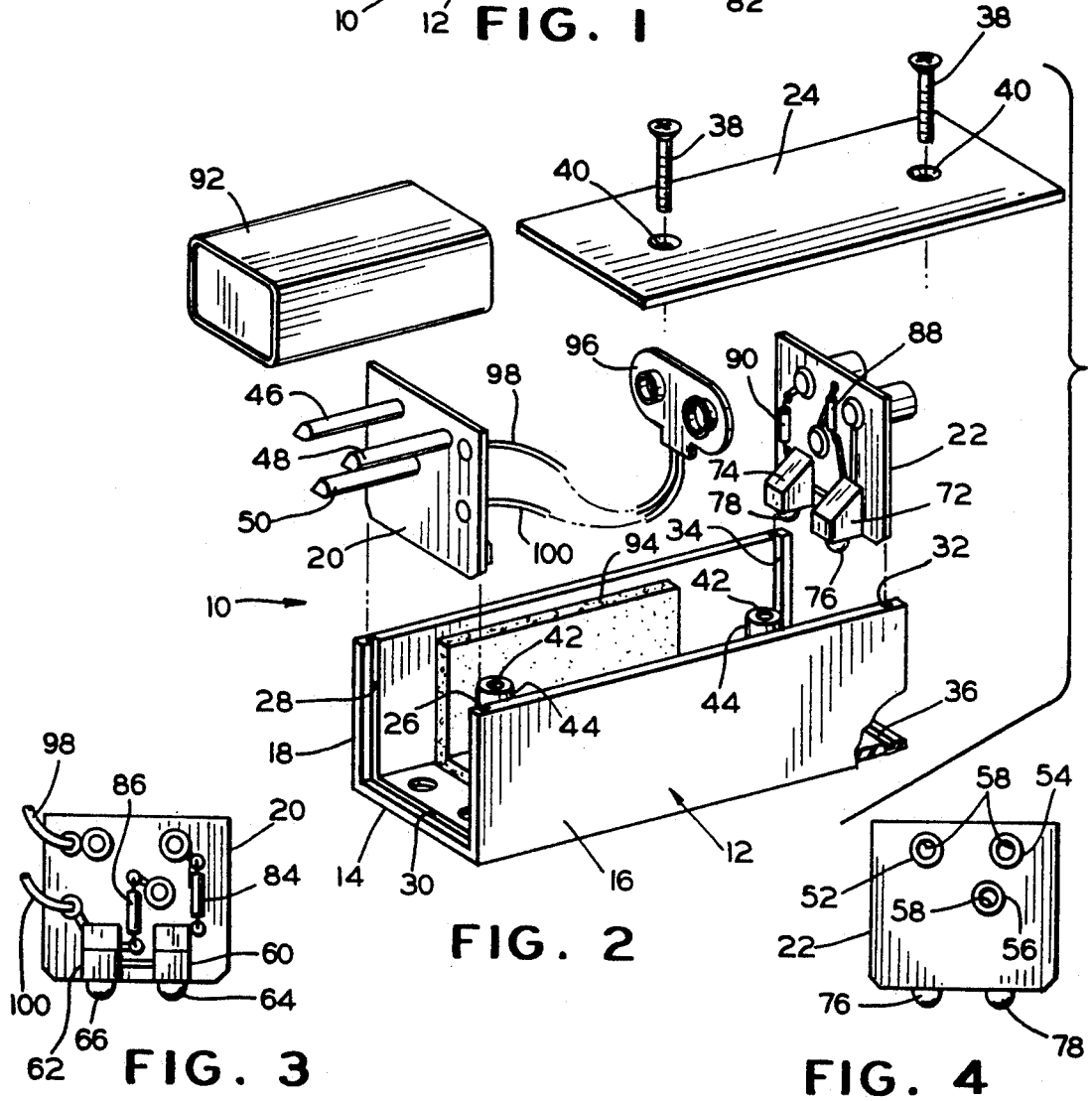

COMPACT LAMP AND CIRCUIT TESTER FOR VEHICLES, PARTICULARLY AUTOMOBILES

This invention relates to a lamp and circuit tester, particularly for vehicles.

The tester is particularly designed for sealed lamps where filaments are not readily visible and for circuit plugs or pigtails which plug into the bases of the lamps.

The tester basically includes an elongate, compact housing having pointed prongs or projections at one end to be inserted into the lamp base and having blunt prongs or projections with recesses at the other end to be received in the circuit plug. Each end of the housing has two light sources, preferably in the form of light emitting diodes (LEDs). These light when the sealed lamp is in good condition and when the circuit is operable. If a single filament lamp and circuit are employed, then only one light source will be activated if the filament or circuit is operable.

The tester is compact, rugged, and reliable and can usually fit in most glove compartments. It uses a standard battery for testing the lamp circuit. The tester also enables a quick check of the lamp and wiring functions, is easy to operate, and is used at the vehicle to eliminate bench testing.

It is, therefore, a principal object of the invention to provide a tester for lamps and lamp circuits of vehicles having the advantages discussed above.

Many other objects and advantages of the invention will be apparent from the following detailed description of a preferred embodiment thereof, references being made to the accompanying drawings, in which:

FIG. 1 is a bottom view of the tester in accordance with the invention;

FIG. 2 is an exploded view in perspective of the tester;

FIG. 3 is an inside view of one of the end walls of the tester;

FIG. 4 is an outside view of the other end wall of the tester; and

FIG. 5 is a schematic wiring diagram of the circuits employed in the tester.

Referring to FIGS. 1 and 2, a tester according the invention for testing sealed lamps and lamp circuits of vehicles is indicated at 10 and includes a housing 12 of rectangular parallelepiped shape. The housing 12 has a bottom wall 14, side walls 16 and 18, end walls 20 and 22, and a removable top wall 24. Of course, the bottom wall 16 could be considered the top wall and the top wall 24 could be considered the bottom wall. The end wall 20 is slidably received in grooves 26, 28, and 30 of the side walls 16 and 18 and the bottom wall 14. Similarly, the end wall 22 is received in grooves 32 and 34 in the side walls 16 and 18, and a bottom groove 36 in the bottom wall 14. The slidable mounting of the end walls 20 and 22 enables easy replacement of either end wall, if necessary, and also facilitates manufacturing of the tester.

The removable top wall 24 receives threaded fasteners 38 through openings 40. The fasteners are threaded into recesses 42 in the upper ends of upright posts 44 which are structurally integral with and extend upwardly from the bottom wall 14.

The end wall 20 has three pointed projections 46, 48, and 50 extending therethrough and outwardly therefrom. These are in predetermined positions so as to be inserted into the base of a lamp.

The end wall 22 has three blunt projections 52, 54, and 56 extending therethrough and outwardly therefrom. These are in predetermined positions to receive the prongs of the plug or pigtail of the lamp circuit, with recesses 58 (FIG. 4) to better cooperate with the prongs of the plug. Both sets of projections are soldered on the inside surfaces of the end walls where they are connected electrically with the testing circuits.

The side wall 20 has lower connectors 60 and 62 (FIG. 3) affixed thereto with light emitting diodes (LEDs) 64 and 66 extending downwardly below the lower edge of the end wall 20. These are visible through ports 68 and 70 (FIG. 1) in the bottom wall 14.

Similarly, the side wall 22 has lower connectors 72 and 74 (FIG. 2) affixed thereto with LEDs 76 and 78. These are visible through ports 80 and 82 (FIG. 1) in the bottom wall 14.

The end wall 20 also has resistors 84 and 86 carried thereby, having ends soldered in small holes in the end wall. These are electrically connected in the testing circuit for the lamp by conductive coating lines on the inside surface of the wall.

Similarly, the end wall 22 has resistors 88 and 90 carried thereby, with ends soldered in small holes in the end wall. Again, these are connected into the testing circuits for the lamp circuit by conductive coating lines on the inside of the end wall 22.

A standard, commercially-available 9-volt battery 92 is located in the housing 12 between the upright posts 44 and is frictionally held by a foam pad 94. This has a standard connector cap 96 which is electrically connected into the lamp circuit by wires 98 and 100. The battery 92, of course, provides a power source for the lamp filaments and no power source is needed for testing the lamp circuit.

The testing circuits for the lamp and lamp circuit are shown schematically in FIG. 5. By way of example, the resistors 84 and 86 are 470 ohms while the resistors 88 and 90 are 1.2 k ohms.

Various modifications of the above-described embodiment of the invention will be apparent to those skilled in the art, and it is to be understood that such modifications can be made without departing from the scope of the invention, if they are within the spirit and the tenor of the accompanying claims.

I claim:

1. A compact tester for testing lamps and lamp circuits of vehicles, said tester comprising a housing of rectangular parallelepiped shape having a bottom wall, two side walls, two end walls slidably received in grooves in end portions of said side walls and said bottom wall, a removable top wall, threaded fasteners affixing said top wall to said housing through upright posts affixed to spaced portions of said bottom wall and having recesses in their upper ends, said bottom wall having two diode ports at each end portion thereof, one of said end walls having two diode connectors at a lower edge portion thereof, two LEDs extending downwardly therefrom and being visible through corresponding diode ports in said bottom wall, said one end wall having three rigid blunt projections extending outwardly therefrom in predetermined positions and having recesses in outer ends thereof to receive prongs of a lamp circuit plug, first circuit means mounted on an inner surface of said one end wall and connecting said projections and said LEDs whereby at least one of said LEDs will light if the lamp circuit is functional, the other of said end walls having second two diode connectors at a lower edge portion thereof, two second LEDs extending downwardly therefrom and being visible through the corresponding two diode ports at the corresponding end of said bottom wall, said other end wall having three rigid pointed projections extending outwardly therefrom in predetermined positions to be received in a base of a lamp to be tested, and second circuit means mounted on the inner surface of said other end wall, said second circuit means including battery means, and said second circuit means being connected to said pointed projections and to said second LEDs to cause at least one of said LEDs to light if the lamp is functional.

2. A tester according to claim 1 wherein said first and second circuit means are formed in part by conductive coating lines on inner surface of said end walls.

3. A tester according to claim 1 wherein said battery means is a battery located in said housing between said upright posts which aid in holding the battery in position.

4. A compact tester for testing lamps and lamp circuits of vehicles, said tester comprising an elongate housing having a bottom wall, two side walls, two end walls slidably received in grooves in end portions of said side walls and said bottom wall, a removable top wall, said bottom wall having two diode ports at each end portion thereof, one of said end walls having two diode connectors at a lower edge portion thereof, two LEDs extending downwardly therefrom and being visible through corresponding diode ports in said bottom wall, said one end wall having three parallel blunt projections extending outwardly therefrom in predetermined positions and having recesses in outer ends thereof to receive a lamp circuit plug, first circuit means connecting said projections and said LEDs whereby at least one of said LEDs will light if the lamp circuit is functional, the other of said end walls having second two diode connectors at a lower edge portion thereof, two second LEDs extending downwardly therefrom and being visible through the corresponding two diode ports at the corresponding end of said bottom wall, said other end wall having three parallel pointed projections extending outwardly therefrom in predetermined positions to be received in a base of a lamp to be tested, and second circuit means including battery means connected to said pointed projections and to said second LEDs to cause at least one of said LEDs to light if the lamp is functional.

5. A tester according to claim 4 wherein said first and second circuit means are formed in part by conductive coating lines on inner surface of said end walls.

6. A tester according to claim 4 wherein said removable top wall is affixed to said housing by threaded fasteners which are received in upright posts affixed to spaced portions of said bottom wall of said housing.

7. A tester according to claim 6 wherein said battery means is a battery located in said housing between said upright posts which aid in holding the battery in position.

8. A tester according to claim 4 wherein said housing is of rectangular parallelepiped shape.

9. A tester for testing lamps and lamp circuits, said tester comprising a housing having end walls, a first light source carried by said housing, a second light source carried by said housing, one end wall having rigid, parallel blunt projections extending outwardly therefrom in predetermined positions to receive a lamp circuit plug, first circuit means connecting said projections and said first light source, the other of said end walls having rigid, parallel pointed projections extending outwardly therefrom in predetermined positions to be received in a base of a lamp to be tested, and second circuit means including battery means connected to said pointed projections and said second light source.

10. A tester according to claim 9 wherein said first and second circuit means are formed in part by conductive coating lines on inner surfaces of said end walls.

11. A tester according to claim 9 wherein said blunt projections have end recesses in which prongs of said lamp circuit plug are received.

12. A tester according to claim 9 wherein said housing has a bottom wall with ports therein through which said light sources are visible.

13. A tester according to claim 9 wherein said first and second light sources are LEDs.

14. A tester according to claim 9 wherein said housing has a removable top wall.

15. A tester according to claim 14 wherein said removable top wall is affixed to said housing by threaded fasteners which are received in upright posts affixed to spaced portions of a bottom wall of said housing.

16. A tester according to claim 15 wherein said battery means is a battery located in said housing between said upright posts which aid in holding the battery in position.

17. A tester according to claim 9 wherein said housing is of rectangular parallelepiped shape.

* * * * *